US007068092B2

(12) United States Patent
Yi et al.

(10) Patent No.: US 7,068,092 B2
(45) Date of Patent: Jun. 27, 2006

(54) COMMON VOLTAGE SOURCE INTEGRATED CIRCUIT FOR LIQUID CRYSTAL DISPLAY DEVICE

(75) Inventors: Sang-Yeol Yi, Gyeonggi-do (KR); Kyong-Seok Kim, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 85 days.

(21) Appl. No.: 10/963,576

(22) Filed: Oct. 14, 2004

(65) Prior Publication Data

US 2005/0140400 A1 Jun. 30, 2005

(30) Foreign Application Priority Data

Dec. 30, 2003 (KR) ...................... 10-2003-0100673
Oct. 7, 2004 (KR) ...................... 10-2004-0079839

(51) Int. Cl.
*H03K 17/04* (2006.01)

(52) U.S. Cl. ....................... 327/374; 327/112; 327/561

(58) Field of Classification Search ................ 327/108, 327/109, 110, 111, 112, 374, 376, 377, 560, 327/561, 562, 563
See application file for complete search history.

(56) References Cited

U.S. PATENT DOCUMENTS 6,677,925 B1 * 1/2004 Kawaguchi et al. .......... 345/98
6,756,958 B1 * 6/2004 Furuhashi et al. ............ 345/95

* cited by examiner

*Primary Examiner*—Jeffrey Zweizig
(74) *Attorney, Agent, or Firm*—Morgan, Lewis & Bockius, LLP

(57) ABSTRACT

A common voltage source IC device includes an operational amplifier, a push-pull circuit receiving an output signal from the operational amplifier and outputting a common voltage to a common voltage terminal; an inverting resistor connected to an inverting input of the operational amplifier; a feedback resistor connected to the common voltage terminal and the inverting input; a capacitor connected to the common voltage terminal and the inverting input; a first switching resistor connected to the inverting input and a first switching transistor, the first switching transistor connected to the common voltage terminal; a driving resistor receiving a drive voltage and connected to a non-inverting input of the operational amplifier; a variable resistor connected to the non-inverting input and a ground source; and a second switching resistor connected to the non-inverting input and a second switching transistor, the second switching transistor connected to the ground source.

30 Claims, 10 Drawing Sheets

COMMON VOLTAGE SOURCE INTEGRATED CIRCUIT FOR LIQUID CRYSTAL DISPLAY DEVICE

The present invention claims the benefit of Korean Patent Application Nos. 2003-0100673 and 2004-0079839 filed on Dec. 30, 2003, and Oct. 7, 2004, respectively, which are hereby incorporated by reference.

BACKGROUND OF THE INVENTION

1. Field of the Invention

The present invention relates to liquid crystal display (LCD) devices, and more particular, to a common voltage source integrated circuit (IC) for an LCD device that reduces a common voltage delay and prevents a block dim and a waving noise in common voltage swings.

2. Discussion of the Related Art

Until recently, display devices generally employed cathode-ray tubes (CRTs) or television monitors. Presently, many efforts are being made to study and develop various types of flat panel displays, such as liquid crystal display devices (LCDs), plasma display panel (PDPs), field emission displays, and electro-luminescence displays (ELDs), as substitutions for CRTs because of their high resolution images, lightness, thin profile, compact size, and low voltage power supply requirements.

In general, an LCD device includes a plurality of pixels arranged in a matrix, and each of the pixels has red-color, green-color, and blue-color sub-pixels. In addition, in a quad-type display device, each pixel has red-color, green-color, blue-color and white-color sub-pixels. During an operation of the LCD device, the gate lines are sequentially driven, thereby sequentially driving thin film transistors formed in the pixels row-by-row, while a data voltage is applied to the thin film transistors. At this time, the data voltage is inversed to a common voltage at every frame in order to change a direction of an electric field because if the electric field is continuously applied in the same direction the liquid crystals are deteriorated. Such a driving method of changing the polarity of data voltage is referred to as an inversion driving method.

FIG. 1 is a circuit diagram of an LCD device according to the related art. In FIG. 1, a liquid crystal display (LCD) device generally includes a liquid crystal panel 2 having a plurality of pixels P arranged in a matrix. The liquid crystal panel 2 includes a plurality of gate lines GL1 to GLm, where m is an integer, and a plurality of data lines DL1 to DLn, where n is an integer. The data lines DL1 to DLn are substantially perpendicular to the gate lines GL1 to GLm. Further, the LCD device includes a data driver 4 connected to the data lines DL1 to DLn and a gate driver 6 connected to the gate lines GL1 to GLm. The LCD device also may include a gamma voltage generator 8 connected to the data driver 4. A thin film transistor is disposed near each crossing of the gate and data lines. The gate driver 6 applies scanning signals to the gate lines GL1 to GLm to sequentially drive the thin film transistors row-by-row.

FIG. 2 is a circuit diagram of a common voltage source IC in the LCD device shown in FIG. 1. In FIG. 2, the common voltage source IC according to the related art includes an operational amplifier AMP and a push-pull circuit P/P. The operational amplifier includes an inverting input (−), an non-inverting input (+), and an output. A control signal CNT is applied to the inverting input (−) of the operational amplifier via a first resistor R1. In addition, the push-pull circuit P/P is connected to the operational amplifier output and a ground source. The push-pull circuit P/P receives a liquid crystal drive voltage VLCD and may output a common voltage Vcom.

Further, the common voltage source IC includes a variable resistor Rv and a driving resistor Ru. The variable resistor Rv is connected to the non-inverting input (+) of the operational amplifier AMP and the ground source. The driving resistor Ru is connected to the non-inverting input (+), and receives the liquid crystal drive voltage VLCD. The common voltage source IC device also includes a capacitor CF and a feedback resistor RF. The capacitor CF and the feedback resistor RF are parallel to each other and are connected between the output of the push-pull circuit P/P and the inverting input (−) of the operational amplifier AMP.

FIG. 3 is a waveform diagram of a control signal applied to the common voltage source IC shown in FIG. 2, and FIG. 4 is a waveform diagram of a common voltage output from the common voltage source IC shown in FIG. 2. As shown in FIG. 3, a control signal having a square waveform may be applied to the common voltage source IC (shown in FIG. 2). The common voltage can be calculated by the following equation (1) in accordance with the principle of inverting amplifier.

$$Vcom = -\frac{RF}{R1} \times CNT + Rv \times \frac{VLCD}{(Ru + Rv)} \qquad \text{Equation (1)}$$

where VLCD is a liquid crystal drive voltage.

As shown in FIG. 4, when the common voltage Vcom is rising and falling, a signal delay (D) occurs due to a load represented by (RF//R1)×CF and a parasitic load parasitized on the lines of the liquid crystal panel. (RF//R1) is a resultant resistor value of the resistors RF and R1 that are connected in parallel.

In order to achieve the proper operation of the liquid crystal display device, the common voltage should reach its highest or lowest point within a blank time. That is, the common voltage swings, such as the common voltage rising and falling, should be performed within the blank time. However, as shown in FIG. 4, the common voltage source IC of the related art does not output the common voltage Vcom properly in time when the data voltage is applied. That is, the common voltage Vcom does not reach its lowest or highest point during the blank time, thereby casing a signal delay (D). As a result, the image quality of the liquid crystal display device is deteriorated. For example, the brightness of the LCD device is lowered, and the block dim and ripple noise are produced during the operation of the LCD device.

SUMMARY OF THE INVENTION

Accordingly, the present invention is directed to a display device and a driving method thereof that substantially obviate one or more of problems due to limitations and disadvantages of the related art.

An object of the present invention is to provide a common voltage source IC that prevents a signal delay of common voltage during common voltage swings.

Another object of the prevent invention is to provide a common voltage source IC that improves display quality of the liquid crystal display device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the common voltage source IC device includes an operational amplifier including an inverting input and a non-inverting input, a push-pull circuit receiving an output signal from the operational amplifier and outputting a common voltage to a common voltage terminal, an inverting resistor receiving a control signal and connected to the inverting input, a feedback resistor connected to the common voltage terminal and the inverting input, a capacitor connected to the common voltage terminal and the inverting input, a first switching resistor connected to the inverting input and a first switching transistor, the first switching transistor receiving a first switching signal and connected to the common voltage terminal, a driving resistor receiving a drive voltage and connected to the non-inverting input, a variable resistor connected to the non-inverting input and a ground source, and a second switching resistor connected to the non-inverting input and a second switching transistor, the second switching transistor receiving a second switching signal and connected to the ground source.

In another aspect, a common voltage source IC device includes an operational amplifier including an inverting input and a non-inverting input, a push-pull circuit receiving an output signal from the operational amplifier and outputting a common voltage to a common voltage terminal, an inverting resistor receiving a control signal and connected to the inverting input, a capacitor connected to the common voltage terminal and the inverting input, a feedback resistor and a first switching resistor connected serially to each other between the common voltage terminal and the inverting input, a first switching transistor connected in parallel with the first switching resistor, the first switching transistor receiving a first switching signal and connected to the common voltage terminal, a driving resistor receiving a drive voltage and connected to the non-inverting input, a variable resistor connected to the non-inverting input and a ground source; and a second switching resistor connected to the non-inverting input and a second switching transistor, the second switching transistor receiving a second switching signal and connected to the ground source.

In another aspect, a common voltage source IC device includes an operational amplifier including an inverting input and a non-inverting input, a push-pull circuit receiving an output signal from the operational amplifier and outputting a common voltage to a common voltage terminal, an inverting resistor receiving a control signal and connected to the inverting input, a feedback resistor connected to the common voltage terminal and the inverting input, a capacitor connected to the common voltage terminal and the inverting input, a first switching transistor receiving a drive voltage and connected to a first switching transistor, the first switching transistor receiving a first switching signal and connected to the non-inverting input, a driving resistor receiving the drive voltage and connected to the non-inverting input, a variable resistor connected to the non-inverting input and a ground source; and a second switching resistor connected to the non-inverting input and a second switching transistor, the second switching transistor receiving a second switching signal and connected to the ground source.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
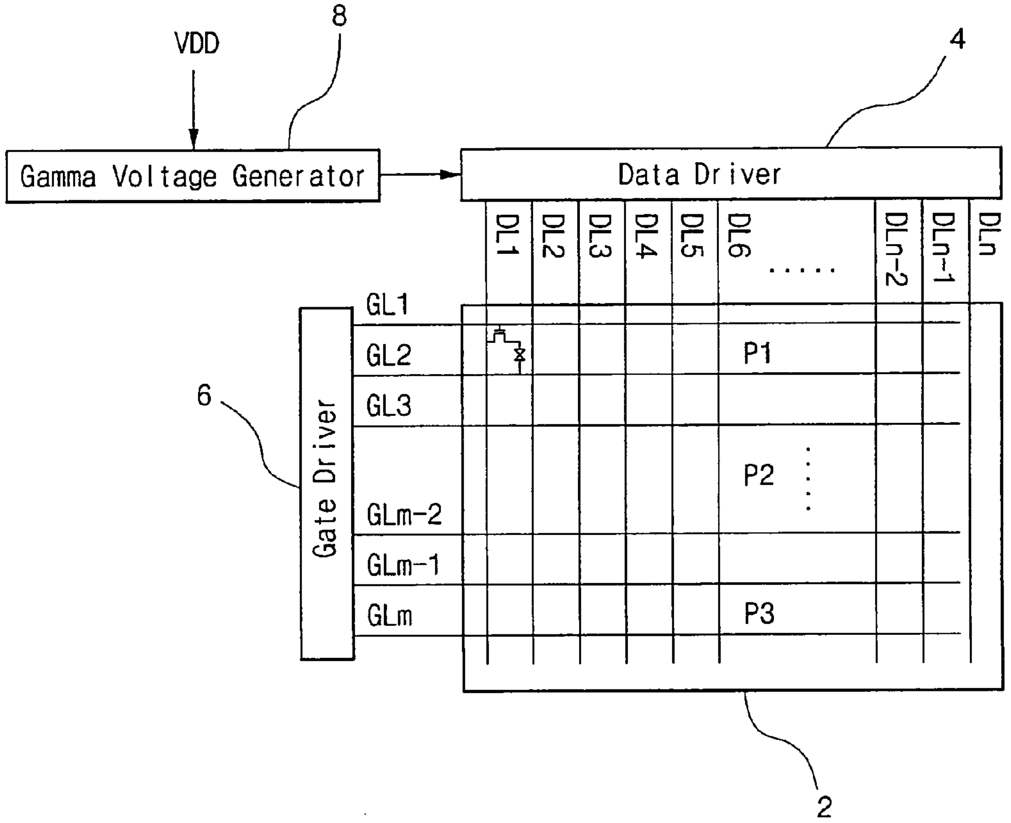
FIG. 1 (Related Art)
FIG. 1 is a circuit diagram of an LCD device according to the related art.
Figure 2:
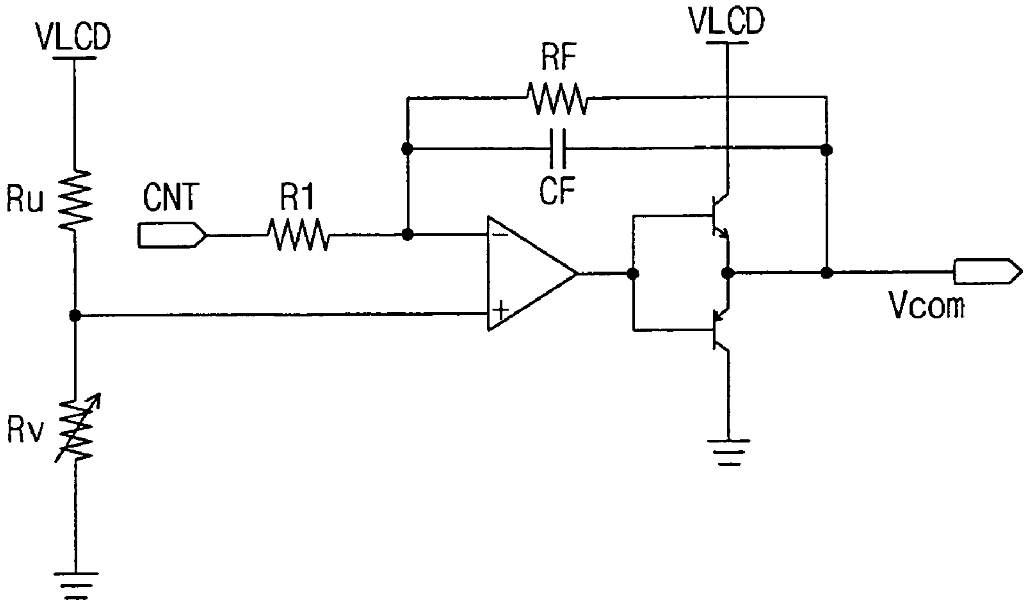
FIG. 2 (Related Art)
FIG. 2 is a circuit diagram of a common voltage source IC in the LCD device shown in FIG. 1.
Figure 3:
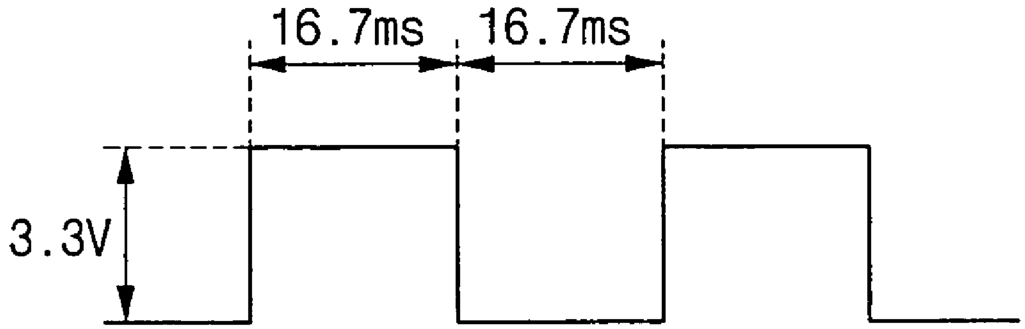
FIG. 3 (Related Art)
FIG. 3 is a waveform diagram of a control signal applied to the common voltage source IC shown in FIG. 2.
Figure 4:
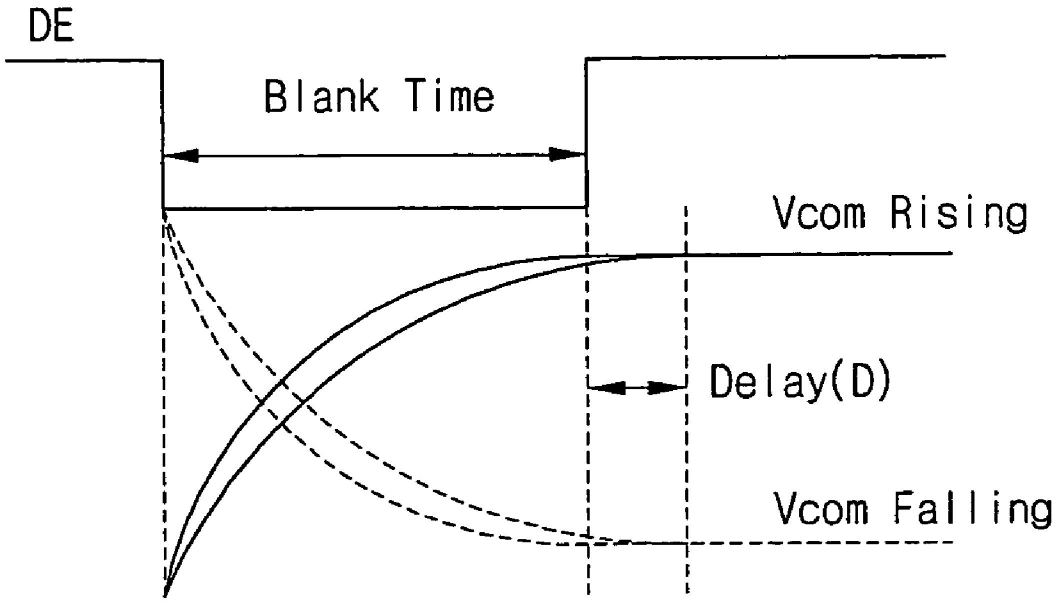
FIG. 4 (Related Art)
FIG. 4 is a waveform diagram of a common voltage output from the common voltage source IC shown in FIG. 2.
Figure 5:
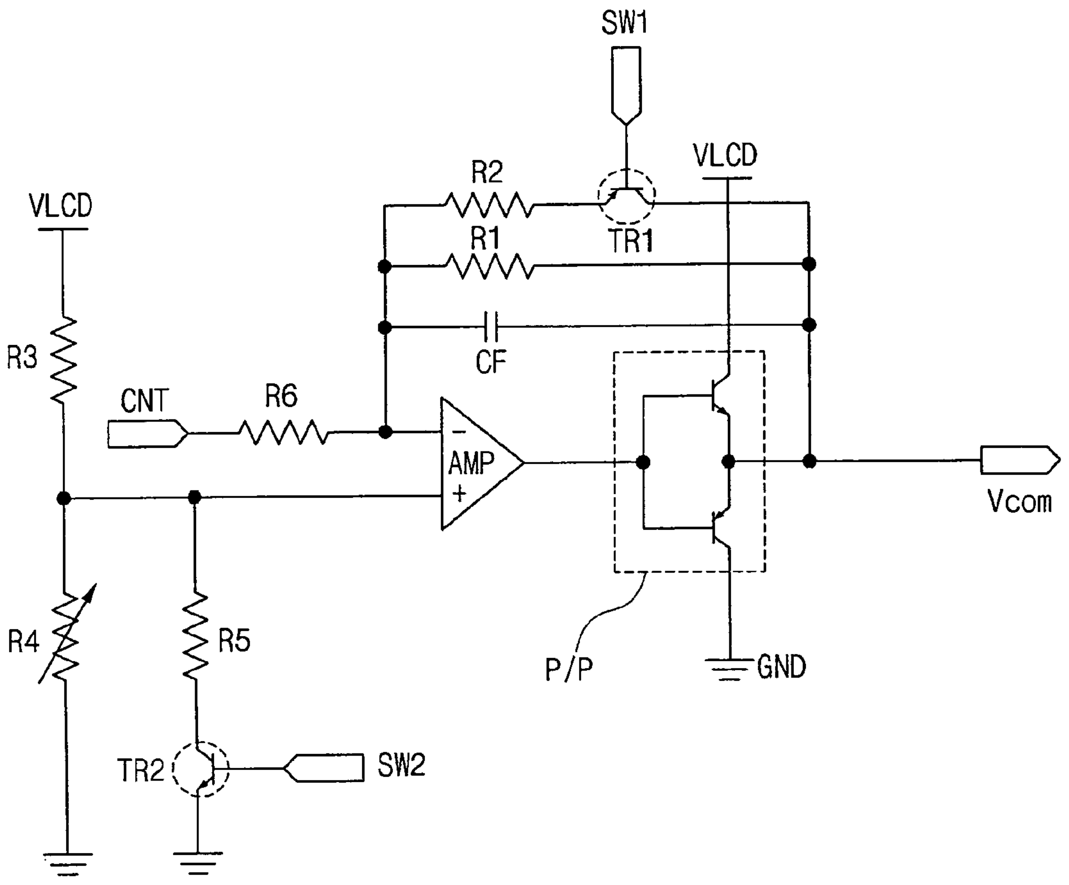
FIG. 5 is an exemplary circuit diagram of a common voltage source IC device according to a first embodiment of the present invention.

FIG. 5 is an exemplary circuit diagram of a common voltage source IC device according to a first embodiment of the present invention. In FIG. 5, a common voltage source IC device may include an operational amplifier AMP and a push-pull circuit P/P. The operational amplifier AMP may be an inverting amplifier performing an inverting amplification and may include an inverting input (−), a non-inverting input (+), and an output. A control signal CNT may be applied to the inverting input (−) of the operational amplifier AMP via a sixth resistor (i.e., inverting resistor) R6. The control signal CNT may include a square waveform and may have a half pulse period of about 16.7 ms. The control signal CNT may induce common voltage swings, such that the common voltage Vcom may have a level change.

In addition, the push-pull circuit P/P may be connected to the operational amplifier output and a ground source GND. The push-pull circuit P/P also may receive a liquid crystal drive voltage VLCD and may output a common voltage Vcom. In particular, the push-pull circuit P/P may accelerate the swings of the signal received from the operational amplifier output based on the liquid crystal drive voltage VLCD such that the common voltage Vcom has a shorter swing time. The push-pull circuit P/P may include one or more transistors.

Further, the common voltage source IC may include a fourth resistor (i.e., variable resistor) R4 and a third resistor (i.e., driving resistor) R3. The variable resistor R4 may control a resistor value during the operation of a liquid crystal display device, thereby preventing a block dim. The variable resistor R4 may be connected to the non-inverting input (+) of the operational amplifier AMP and the ground source. The driving resistor R3 also may be connected to the non-inverting input (+), and the driving resistor R3 may receive the liquid crystal drive voltage VLCD.

The common voltage source IC device also may include a capacitor CF and a first resistor (i.e., feedback resistor) R1. The capacitor CF and the feedback resistor R1 may be parallel to each other and may be connected between the output of the push-pull circuit P/P and the inverting input (−) of the operational amplifier AMP. The capacitor CF and the feed back resistor R1 may prevent noise and ripple from being fed back to the operational amplifier AMP, because if the noise is fed back to the input of the operational amplifier AMP, the feedback noise would enter the liquid crystal panel and would cause ripple noises in the entire liquid crystal display.

Moreover, the common voltage source IC device may include first and second transistors TR1 and TR2. The first and second transistors TR1 and TR2 may receive first and second switching signals SW1 and SW2, respectively. The first and second switching signals SW1 and SW2 may include square waves and may correspond to the control signal CNT. In particular, the first switching transistor TR1 may be connected to a second resistor (i.e., first switching resistor) R2 serially between the output of the push-pull circuit P/P and the inverting input (−) of the operational amplifier AMP. In addition, the second switching transistor TR2 may be connected to a fifth resistor (i.e., second switching resistor) R5 serially between the non-inverting input (+) of the operational amplifier AMP and the ground source.

As a result, the combination of the feedback resistor R1, the first switching resistor R2 and the inverting resistor R6 may convert the first switching signal SW1 to output the common voltage Vcom. Further, the combination of the driving resistor R3, the variable resistor R4 and the second switching resistor R5 may covert the second switching signal SW2 to output the common voltage Vcom. Thus, these resistors and the combinations of their resistor values may adjust the waveform of common voltage swings of the common voltage Vcom being outputted by the common voltage source IC.

Figure 6:
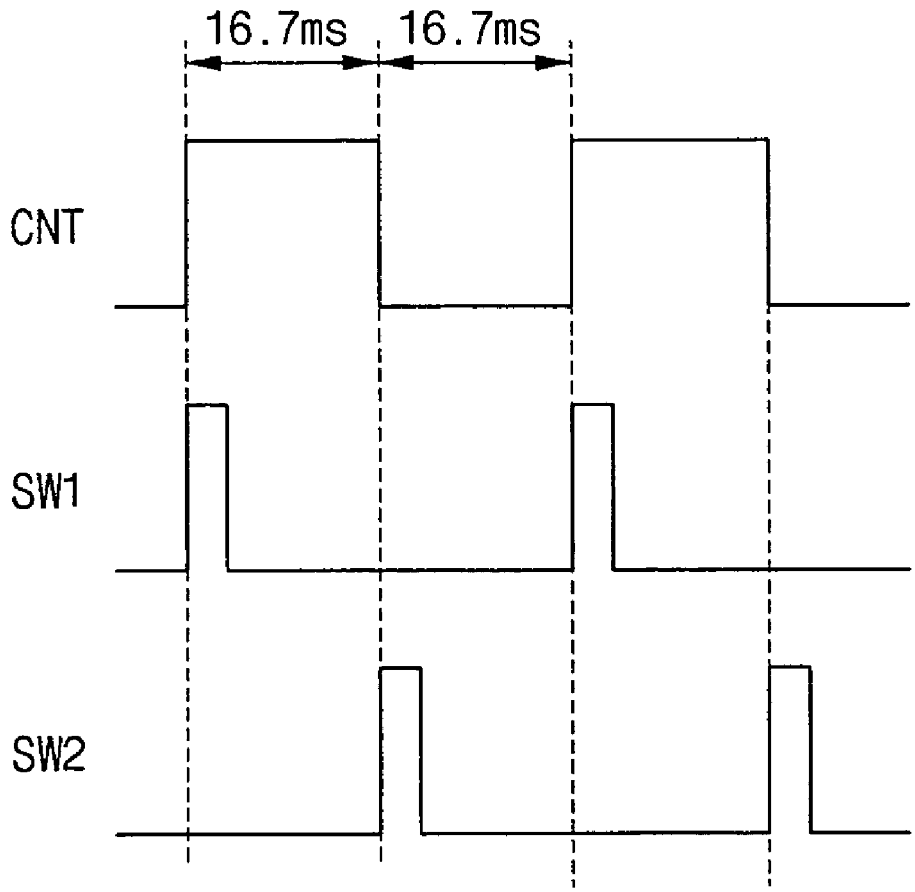
FIG. 6 is a waveform diagram of signals applied to the common voltage source IC device of an embodiment of the present invention.
Figure 7:
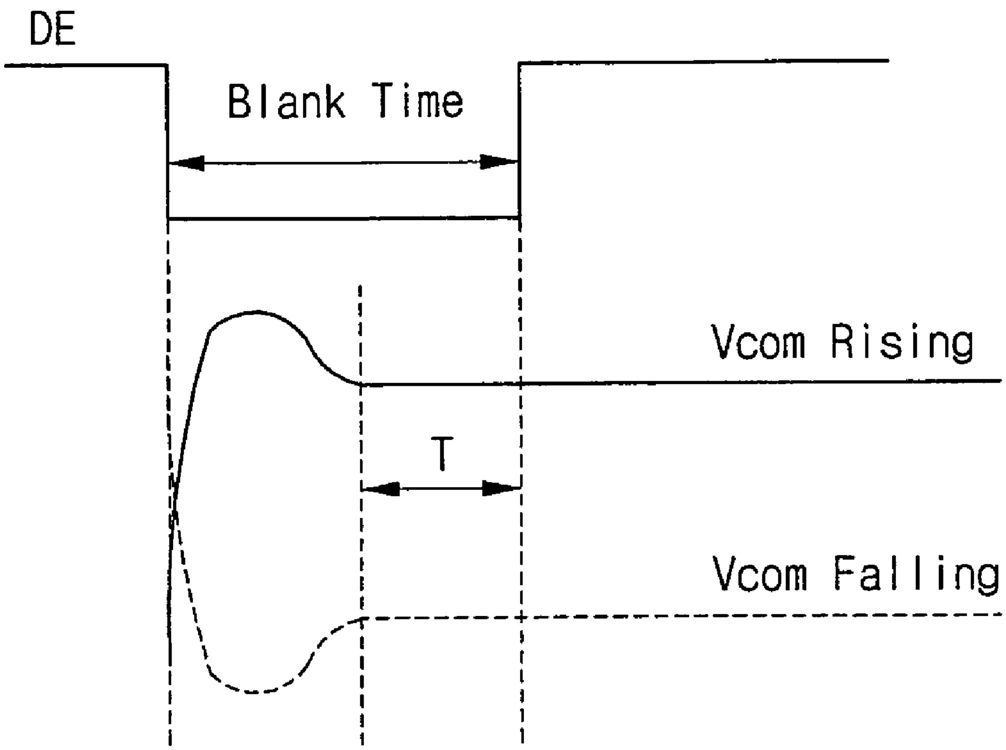
FIG. 7 is a waveform diagram of a common voltage output from the common voltage source IC of an embodiment of the present invention.

FIG. 6 is a waveform diagram of signals applied to the common voltage source IC device of an embodiment of the present invention, and FIG. 7 is a waveform diagram of a common voltage output from the common voltage source IC device of an embodiment of the present invention. As shown in FIG. 6, the control signal CNT may include a square wave having a half period of about 16.7 ms and being in a high state or a low state alternatively.

The first switching signal SW1 may change its state when the control signal CNT is rising, i.e., the control signal CNT is transitioning from the low state to the high state. In addition, the second switching signal SW2 may change its state when the control signal CNT is falling, i.e., when the control signal CNT is transitioning from the high state to the low state. In particular, if the first switching transistor TR1 (shown in FIG. 5) is a P-type transistor, the first switching transistor TR1 (shown in FIG. 5) may be turned OFF when the first switching signal SW1 is in the high state. On the other hand, the first switching transistor TR1 may be turned ON when the first switching signal SW1 is in the low state. If the second switching transistor TR2 (shown in FIG. 5) is an N-type transistor, the second switching transistor TR2 (shown in FIG. 5) may be turned ON when the second switching signal SW2 is in the high state. Conversely, the second switching transistor TR2 may be OFF when the second switching signal SW2 is in the low state.

Therefore, if the first switching signal SW1 is changed from the high state to the low state, i.e., if the first switching transistor TR1 maintains the ON state, an output gain may be represented by (−Rt/R6). At this time, Rt may be a resultant resistor value calculated by the following equation (2):

$$Rt = (R2 \,//\, R1) = \frac{R2 \times R1}{R2 + R1} \qquad \text{Equation (2)}$$

After that, if the first switching signal SW1 is changed from the low state to the high state, i.e., if the first switching transistor TR1 maintains the OFF state, an operational amplifier gain inputting into the inverting input (−) of the operational amplifier AMP (shown in FIG. 5) may change into (−R1/R6).

In other words, when the first switching signal SW1 sets the first switching transistor TR1 in a period of the OFF state, the combination resistor for the operational amplifier gain is changed into the first resistor (feedback resistor) R1 that is larger than (R2//R1). Therefore, when the common voltage is rising, the operational amplifier gain of the operational amplifier AMP (shown in FIG. 5) increases. Furthermore, the operational amplifier gain may be changed to overdrive when the common voltage is rising, thereby shortening the falling and rising time of the common voltage Vcom by as much as T, as shown in FIG. 7.

In addition, the common voltage DC level inputting into the non-inverting input (+) of the operational amplifier AMP (shown in FIG. 5) may change from R4×VLCD/(R3+R4) to Rb×VLCD/(R3+Rb) when the second switching signal SW2 is in transition from the low state to the high state. At this time, Rb may be a second resultant resistor value calculated by the following equation (3):

$$Rb = (R4 \,//\, R5) = \frac{R4 \times R5}{R4 + R5} \qquad \text{Equation (3)}$$

Namely, when the N-type second switching transistor TR2 is turned ON, the variable resistor value (R4) that is the value during the low state (i.e., OFF state) of the second switching signal SW2 is changed into (R4×R5)/(R4+R5). Therefore, the operational amplifier gain may be changed to overdrive as the common voltage DC level is dramatically falling due to the resistance decrease. Further, when the common voltage is falling, the falling and rising time of the common voltage Vcom is shortened by as much as T, as shown in FIG. 7. However, the common voltage DC level increases again at the time when the second switching signal SW2 is changed from the high state to the low state.

Figure 9:
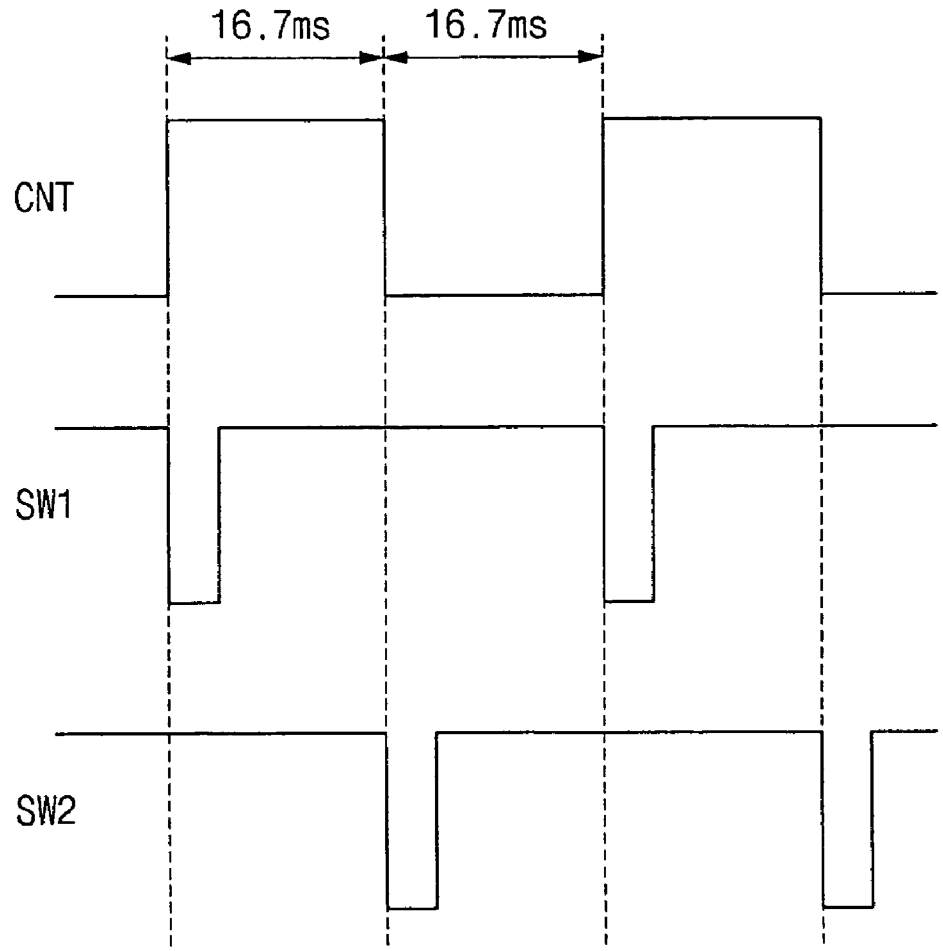
FIG. 9 is a waveform diagram of another signals applied to the common voltage source IC device of embodiments of the present invention.

According to the first embodiment described hereinbefore, the first and second switching transistors TR1 and TR2 are the P-type and N-type transistors, respectively, and then the combination resistors are induced by the first and second switching signals. However, other types of transistors or other structure of electric circuit are possible for the common voltage source IC device. When the transistor type is changed, the switching signals will also be changed as shown in FIG. 9. Namely, if the first and second switching transistors TR1 and TR2 are N-type and P-type transistors, respectively, first and second signals shown in FIG. 9 are applied to the N-type first transistor TR1 and the P-type second transistor TR2, respectively.

Figure 8:
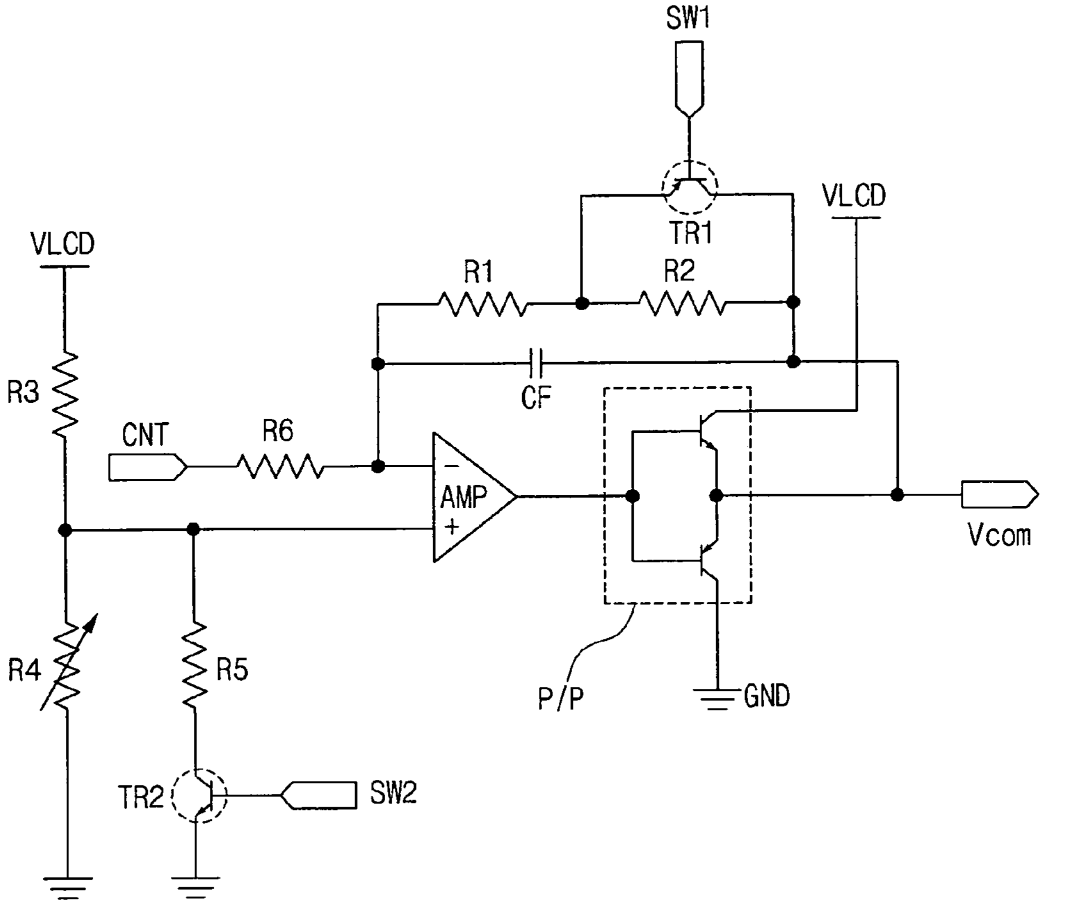
FIG. 8 is an exemplary circuit diagram of a common voltage source IC device according to a second embodiment of the present invention.

FIG. 8 is an exemplary circuit diagram of a common voltage source IC device according to a second embodiment of the present invention. In FIG. 8, similar to the first embodiment, a common voltage source IC device may include an operational amplifier AMP and a push-pull circuit P/P. The operational amplifier AMP may be an inverting amplifier performing an inverting amplification and may include an inverting input (−), a non-inverting input (+), and an output. A control signal CNT may be applied to the inverting input (−) of the operational amplifier AMP via a sixth resistor R6. The control signal CNT may include a square waveform and may have a half pulse period of about 16.7 ms, as shown in FIGS. 6 and 9. The control signal CNT may induce common voltage swings, such that the common voltage Vcom may have a level change.

In addition, the push-pull circuit P/P may be connected to the operational amplifier output and a ground source GND. The push-pull circuit P/P also may receive a liquid crystal drive voltage VLCD and may output a common voltage Vcom. In particular, the push-pull circuit P/P may accelerate the swings of the signal received from the operational amplifier output based on the liquid crystal drive voltage VLCD such that the common voltage Vcom has a shorter swing time. The push-pull circuit P/P may include one or more transistors.

Further, the common voltage source IC may include a fourth resistor (i.e., variable resistor) R4 and a third resistor (i.e., driving resistor) R3. The fourth resistor R4 may be a variable resistor, and may control a resistor value during the operation of a liquid crystal display device, thereby preventing a block dim. The fourth resistor R4 may be connected to the non-inverting input (+) of the operational amplifier AMP and the ground source. Also, the third resistor R3 also may be connected to the non-inverting input (+), and the third resistor R3 may receive the liquid crystal drive voltage VLCD.

The common voltage source IC device may also include a capacitor CF, a first resistor R1, and a second resistor R2. The capacitor CF may be parallel to both the first and second resistors R1 and R2, but the first and second resistors R1 and R2 may be connected in series. The capacitor CF and the first and second resistors R1 and R2 may be connected between the output of the push-pull circuit P/P and the inverting input (−) of the operational amplifier AMP. The capacitor CF and the first and second resistors R1 and R2 may prevent noise and ripple from being fed back to the operational amplifier AMP, because if the noise is fed back to the input of the operational amplifier AMP, the feedback noise may enter the liquid crystal panel and cause ripple noises in the entire liquid crystal display.

Moreover, the common voltage source IC device may include first and second transistors TR1 and TR2. The first and second transistors TR1 and TR2 may receive first and second switching signals SW1 and SW2, respectively. The first and second switching signals SW1 and SW2 may include square waves and may correspond to the control signal CNT. In particular, the first switching transistor TR1 may be connected to the second resistor R2 in parallel between the output of the push-pull circuit P/P and the first resistor R1. In addition, the second switching transistor TR2 may be connected to a fifth resistor R5 serially between the non-inverting input (+) of the operational amplifier AMP and the ground source.

As a result, the combination of the first resistor R1, the second resistor R2 and the sixth resistor R6 and the combination of the third resistor R3, the fourth resistor R4 and the fifth resistor R5 may control the rising and falling time of the common voltage Vcom in accordance with the first and second switching signals SW1 and SW2. Namely, the combination of the first resistor R1, the second resistor R2 and the sixth resistor R6 may convert the first switching signal SW1 to output the common voltage Vcom, and the combination of the third resistor R3, the fourth resistor R4 and the fifth switching resistor R5 may covert the second switching signal SW2 to output the common voltage Vcom. These resistors and the combinations of their resistor values may adjust the waveform of common voltage swings of the common voltage Vcom being outputted by the common voltage source IC.

The principle of overdriving the common voltage Vcom will be explained with reference to FIGS. 6 and 7. The overdriving method may be the same as the first embodiment depicted in FIG. 5.

As described before, the first switching signal SW1 may change its state when the control signal CNT is rising, i.e., the control signal CNT is in transition from the low state to the high state. In addition, the second switching signal SW2 may change its state when the control signal CNT is falling, i.e., when the control signal CNT is in transition from the high state to the low state. In particular, if the first switching transistor TR1 (shown in FIG. 8) is a P-type transistor, the first switching transistor TR1 (shown in FIG. 8) may be turned OFF when the first switching signal SW1 is in the high state, and the first switching transistor TR1 (shown in FIG. 8) may be turned ON when the first switching signal SW1 is in the low state. If the second switching transistor TR2 (shown in FIG. 8) is an N-type transistor, the second switching transistor TR2 (shown in FIG. 8) may be turned ON when the second switching signal SW2 is in the high state, and the second switching transistor TR2 may be OFF when the second switching signal SW2 (shown in FIG. 8) is in the low state.

With reference to FIGS. 6 and 8, when the first switching signal SW1 is changed from the high state to the low state, i.e., when the p-type first switching transistor TR1 maintains the ON state, an output gain may be represented by (−R1/R6).

Thereafter, when the first switching signal SW1 is changed from the low state to the high state, i.e., when the first switching transistor TR1 maintains the OFF state, an operational amplifier gain inputting into the inverting input (−) of the operational amplifier AMP (shown in FIG. 8) may change into (−R1+R2/R6).

In other words, when the first switching signal SW1 sets switching transistor TR1 in a period of the OFF state, the combination resistor for the operational amplifier gain is changed into (R1+R2) that is larger than the first resistor R1. Therefore, when the common voltage is rising, the operational amplifier gain of the operational amplifier AMP (shown in FIG. 8) increases, and the operational amplifier gain may be changed to overdrive, thereby shortening the falling and rising time of the common voltage Vcom by as much as T, as shown in FIG. 7.

In addition, the common voltage DC level inputting into the non-inverting input (+) of the operational amplifier AMP (shown in FIG. 5) may change from R4×VLCD/(R3+R4) to Rb×VLCD/(R3+Rb) when the second switching signal SW2 is in transition from the low state to the high state. At this time, Rb may be a second resultant resistor value calculated by the following equation (3):

$$Rb = \frac{R4 \times R5}{R4 + R5} \quad \text{Equation (4)}$$

Namely, when the N-type second switching transistor TR2 is turned ON, the variable resistor value (R4) that is the value during the low state (i.e., OFF state) of the second switching signal SW2 is changed into (R4×R5)/(R4+R5). Therefore, the operational amplifier gain may be changed to overdrive as the common voltage DC level is dramatically falling due to the resistance decrease. Further, when the common voltage is falling, the falling and rising time of the common voltage Vcom is shortened by as much as T, as shown in FIG. 7. However, the common voltage DC level increases again at the time when the second switching signal SW2 is changed from the high state to the low state. The common voltage swing caused by the second embodiment of FIG. 8 is the same as that of the first embodiment.

According to the second embodiment described hereinbefore, the first and second switching transistors TR1 and TR2 are P-type and N-type transistors, respectively, and then the combination resistors are induced by the first and second switching signals. However, other types of transistors or other structure of electric circuit may be possible for the common voltage source IC device. When the transistor type is changed, the switching signals will also be changed as shown in FIG. 9. Namely, if the first and second switching transistors TR1 and TR2 are N-type and P-type transistors, respectively, first and second signals shown in FIG. 9 are applied to the N-type first transistor TR1 and the P-type second transistor TR2, respectively.

Figure 10:
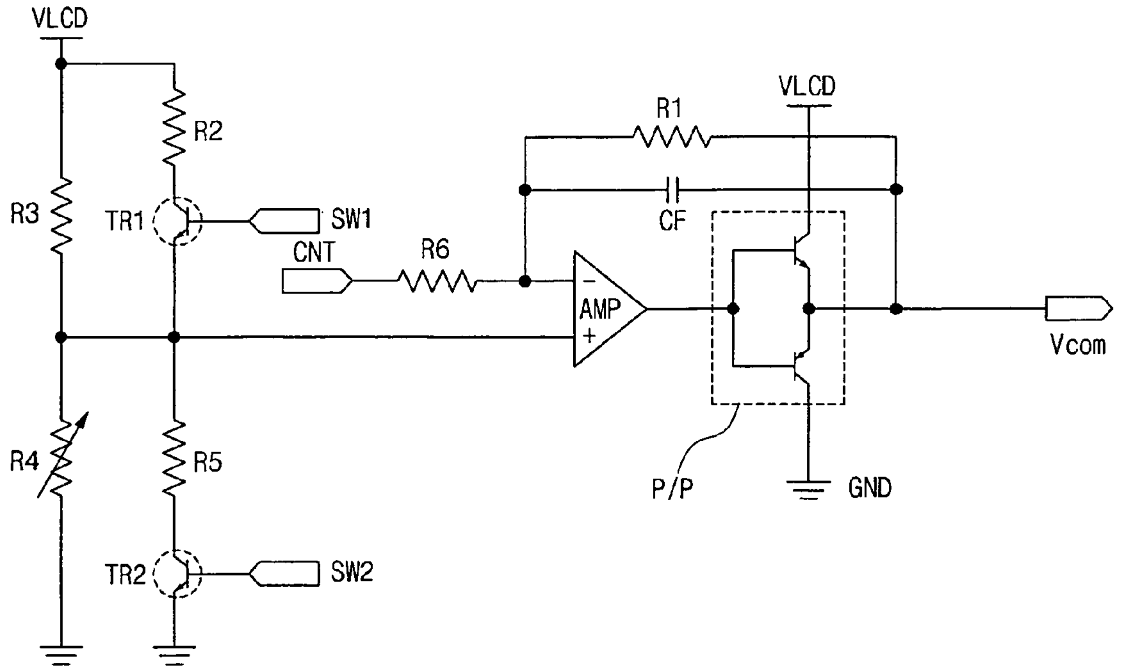
FIG. 10 is an exemplary circuit diagram of a common voltage source IC device according to a third embodiment of the present invention.

FIG. 10 is an exemplary circuit diagram of a common voltage source IC device according to a third embodiment of the present invention. In FIG. 10, similar to the first and second embodiments, a common voltage source IC device may include an operational amplifier AMP and a push-pull circuit P/P. The operational amplifier AMP may be an inverting amplifier performing an inverting amplification and may include an inverting input (−), a non-inverting input (+), and an output. A control signal CNT may be applied to the inverting input (−) of the operational amplifier AMP via a sixth resistor R6. The control signal CNT may include a square waveform and may have a half pulse period of about 16.7 ms, as shown in FIGS. 6 and 9. The control signal CNT may induce common voltage swings, such that the common voltage Vcom may have a level change.

In addition, the push-pull circuit P/P may be connected to the operational amplifier output and a ground source GND. The push-pull circuit P/P may also receive a liquid crystal drive voltage VLCD and may output a common voltage Vcom. In particular, the push-pull circuit P/P may accelerate the swings of the signal received from the operational amplifier output based on the liquid crystal drive voltage VLCD such that the common voltage Vcom has a shorter swing time. The push-pull circuit P/P may include one or more transistors.

Further, the common voltage source IC may include a fourth resistor (i.e., variable resistor) and a third resistor (i.e., driving resistor) R3. The fourth resistor R4 may be a variable resistor R4, and may control a resistor value during the operation of a liquid crystal display device, thereby preventing a block dim. The fourth resistor R4 may be connected to the non-inverting input (+) of the operational amplifier AMP and the ground source. The third resistor R3 also may be connected to the non-inverting input (+), and the third resistor R3 may receive the liquid crystal drive voltage VLCD.

The common voltage source IC device also may include a capacitor CF and a first resistor (i.e., feedback resistor) R1. The capacitor CF and the first resistor R1 may be parallel to each other and may be connected between the output of the push-pull circuit P/P and the inverting input (−) of the operational amplifier AMP. The capacitor CF and the first resistor R1 may prevent noise and ripple from being fed back to the operational amplifier AMP, because if the noise is fed back to the input of the operational amplifier AMP, the feedback noise may enter the liquid crystal panel and cause ripple noises in the entire liquid crystal display.

Moreover, the common voltage source IC device may include first and second transistors TR1 and TR2. The first and second transistors TR1 and TR2 may receive first and second switching signals SW1 and SW2, respectively. The first and second switching signals SW1 and SW2 may include square waves and may correspond to the control signal CNT. In particular, unlike the first and second embodiments, the first switching transistor TR1 may be connected to a second resistor (i.e., first switching resistor) R2 serially between the liquid crystal drive voltage source VLCD and the non-inverting input (+) of the operational amplifier AMP. In addition, the second switching transistor TR2 may be connected to a fifth resistor (i.e., second switching resistor) R5 serially between the non-inverting input (+) of the operational amplifier AMP and the ground source.

As a result, the combination of the second resistor R2, the third resistor R3, the fourth resistor R4 and the fifth resistor R5 may control the rising and falling time of the common voltage Vcom in accordance with the first and second switching signals SW1 and SW2. Namely, the combination of the second to fifth resistors R2–R5 may convert the first and second switching signals SW1 and SW2 to output the common voltage Vcom. These resistors and the combinations of their resistor values may adjust the waveform of common voltage swings of the common voltage Vcom being outputted by the common voltage source IC.

The principle of overdriving the common voltage Vcom will be explained with reference to FIGS. 6, 7 and 10. The overdriving method may be the same as the first and second embodiments described herein before, but the driving voltage DC level inputted into the non-inverting input (+) of the operational amplifier AMP (shown in FIG. 10) are controlled by the transistors TR1 and TR2 and resistors R2–R5 to perform the common voltage level swing.

As described in FIG. 6, the first switching signal SW1 may change its state when the control signal CNT is rising, i.e., the control signal CNT is in transition from the low state to the high state. In addition, the second switching signal SW2 may change its state when the control signal CNT is falling, i.e., when the control signal CNT is in transition from the high state to the low state. In this third embodiment, it is assumed that the first and second switching transistors TR1 and TR2 (shown in FIG. 10) are all N-type transistors. Therefore, the first and second switching transistors TR1 and TR2 (shown in FIG. 10) may be turned ON when the first and second switching signals SW1 and SW2 are in the high state, and the first and second switching transistors TR1 and TR2 may be OFF when the first and second switching signals SW1 and SW2 (shown in FIG. 10) are in the low state.

With reference to FIGS. 6 and 10, when the first switching signal SW1 is in the low state, i.e., when the n-type first switching transistor TR1 maintains the OFF state, an output gain may be represented by R4×VLCD/(R3+R4).

After that, when the first switching signal SW1 is changed from the low state to the high state, i.e., when the first switching transistor TR1 maintains the ON state, an operational amplifier gain inputting into the non-inverting input (+) of the operational amplifier AMP (shown in FIG. 8) may change into R4×VLCD/(Rh+R4). Rh may be a second resultant resistor value calculated by the following equation (4):

$$Rh = (R3 // R5) = \frac{R3 \times R5}{R3 + R5} \quad \text{Equation (3)}$$

In other words, when the first switching signal SW1 sets the first switching transistor TR1 in a period of the ON state, the common voltage DC level inputted into the non-inverting input (+) increases. Therefore, when the common voltage is rising, the operational amplifier gain of the operational amplifier AMP (shown in FIG. 10) increases, and the operational amplifier gain may be changed to overdrive, thereby shortening the falling and rising time of the common voltage Vcom by as much as T, as shown in FIG. 7. However, the common voltage DC level decreases at the time when the first switching signal SW1 is changed from the high state to the low state.

In addition, when the second switching signal SW2 is in the low state, i.e., when the n-type first switching transistor TR1 maintains the OFF state, an output gain may be represented by R4×VLCD/(R3+R4). After that, when the second switching signal SW2 is in transition from the low state to the high state, i.e., when the second switching transistor TR2 maintains the ON state, an operational amplifier gain inputting into the non-inverting input (+) of the operational amplifier AMP (shown in FIG. 10) may change into Rm×VLCD/(R3+Rm). Rm may be a second resultant resistor value calculated by the following equation (5):

$$Rm = (R4 // R6) = \frac{R4 \times R6}{R4 + R6} \quad \text{Equation (5)}$$

In other words, when the second switching signal SW1 sets the second switching transistor TR2 in a period of the OFF state, the common voltage DC level inputted into the non-inverting input (+) decreases. Therefore, when the common voltage is falling, the operational amplifier gain of the operational amplifier AMP (shown in FIG. 10) decreases, and the operational amplifier gain may be changed to overdrive, thereby shortening the falling and rising time of the common voltage Vcom by as much as T, as shown in FIG. 7. However, the common voltage DC level increases at the time when the second switching signal SW1 is changed from the high state to the low state.

According to the third embodiment described hereinbefore, the first and second switching transistors TR1 and TR2 are all the N-type transistors. However, the P-type transistor is possible to be employed as the first and second transistors TR1 and TR2. When the transistor type is changed into the P-type, the switching signals will also be changed as shown in FIG. 9. Namely, if the first and second switching transistors TR1 and TR2 are the P-type transistors, first and second signals shown in FIG. 9 are applied to the P-type first and second transistors TR1 and TR2.

Accordingly, the common voltage source IC of the embodiments of the present invention prevents the delay of the common voltage rising and falling in the common voltage swings because additional resistor and switching elements are included to adjust the operational amplifier gain. Since the falling and rising times of the common voltage is reduced, the image quality of the liquid crystal display device increases according to an embodiment of the present invention.

It will be apparent to those skilled in the art that various modifications and variations can be made in the common voltage source IC for a liquid crystal display device of the present invention without departing from the spirit or scope of the invention. Thus, it is intended that the present invention covers the modifications and variations of this invention provided they come within the scope of the appended claims and their equivalents.

What is claimed is:

1. A common voltage source IC device, comprising:
- an operational amplifier including an inverting input and a non-inverting input;
- a push-pull circuit receiving an output signal from the operational amplifier and outputting a common voltage to a common voltage terminal;
- an inverting resistor receiving a control signal and connected to the inverting input;
- a feedback resistor connected to the common voltage terminal and the inverting input;
- a capacitor connected to the common voltage terminal and the inverting input;
- a first switching resistor connected to the inverting input and a first switching transistor, the first switching transistor receiving a first switching signal and connected to the common voltage terminal;
- a driving resistor receiving a drive voltage and connected to the non-inverting input;
- a variable resistor connected to the non-inverting input and a ground source; and
- a second switching resistor connected to the non-inverting input and a second switching transistor, the second switching transistor receiving a second switching signal and connected to the ground source.

2. The device according to claim 1, wherein the operational amplifier is an inverting amplifier.

3. The device according to claim 1, wherein the push-pull circuit includes at least one transistor.

4. The device according to claim 1, wherein the push-pull circuit receives the drive voltage and connects to the ground source.

5. The device according to claim 1, wherein the control signal includes a square wave.

6. The device according to claim 1, wherein the control signal has a half period of about 16.7 ms.

7. The device according to claim 1, wherein the first switching signal changes at about the same time as the control signal is rising.

8. The device according to claim 1, wherein the second switching signal changes at about the same time as the control signal is falling.

9. The device according to claim 1, wherein the feedback resistor, the capacitor and the first switching resistor are parallel to one another.

10. The device according to claim 1, wherein the first and second switching transistors have polarities different from each other.

11. A common voltage source IC device, comprising:

an operational amplifier including an inverting input and a non-inverting input;

a push-pull circuit receiving an output signal from the operational amplifier and outputting a common voltage to a common voltage terminal;

an inverting resistor receiving a control signal and connected to the inverting input;

a capacitor connected to the common voltage terminal and the inverting input;

a feedback resistor and a first switching resistor connected serially to each other between the common voltage terminal and the inverting input;

a first switching transistor connected in parallel with the first switching resistor, the first switching transistor receiving a first switching signal and connected to the common voltage terminal;

a driving resistor receiving–a drive voltage and connected to the non-inverting input;

a variable resistor connected to the non-inverting input and a ground source; and a second switching resistor connected to the non-inverting input and a second switching transistor, the second switching transistor receiving a second switching signal and connected to the ground source.

12. The device according to claim 11, wherein the operational amplifier includes an inverting amplifier.

13. The device according to claim 11, wherein the push-pull circuit has at least one transistor.

14. The device according to claim 11, wherein the push-pull circuit receives the drive voltage and is connected to the ground source.

15. The device according to claim 11, wherein the control signal includes a square wave.

16. The device according to claim 11, wherein the control signal has a half period of about 16.7 ms.

17. The device according to claim 11, wherein the first switching signal changes at about the same time as the control signal is rising.

18. The device according to claim 11, wherein the second switching signal changes at about the same time as the control signal is falling.

19. The device according to claim 11, wherein the capacitor, the feedback resistor and first switching resistor are connected in parallel.

20. The device according to claim 11, wherein the first and second switching transistors have polarities different from each other.

21. A common voltage source IC device, comprising:

an operational amplifier including an inverting input and a non-inverting input;

a push-pull circuit receiving an output signal from the operational amplifier and outputting a common voltage to a common voltage terminal;

an inverting resistor receiving a control signal and connected to the inverting input;

a feedback resistor connected to the common voltage terminal and the inverting input;

a capacitor connected to the common voltage terminal and the inverting input;

a first switching resistor receiving a drive voltage and connected to a first switching transistor, the first switching transistor receiving a first switching signal and connected to the non-inverting input;

a driving resistor receiving the drive voltage and connected to the non-inverting input;

a variable resistor connected to the non-inverting input and a ground source; and a second switching resistor connected to the non-inverting input and a second switching transistor, the second switching transistor receiving a second switching signal and connected to the ground source.

22. The device according to claim 21, wherein the operational amplifier includes an inverting amplifier.

23. The device according to claim 21, wherein the push-pull circuit has at least one transistor.

24. The device according to claim 21, wherein the push-pull circuit receives the drive voltage and connects to the ground source.

25. The device according to claim 21, wherein the control signal includes a square wave.

26. The device according to claim 21, wherein the control signal has a half period of about 16.7 ms.

27. The device according to claim 21, wherein the first switching signal changes at about the same time as the control signal is rising.

28. The device according to claim 21, wherein the second switching signal changes at about the same time as the control signal is falling.

29. The device according to claim 21, wherein the capacitor and the feedback resistor are connected in parallel to each other.

30. The device according to claim 22, wherein the first and second switching transistors have the same polarity.

* * * * *